(12) United States Patent
Phan Le et al.

(10) Patent No.: US 8,269,578 B2
(45) Date of Patent: Sep. 18, 2012

(54) RESONATOR HAVING A SIDEWAYS OSCILLATION COMPRESSING ONE CONNECTOR WHILE EXTENDING ANOTHER

(75) Inventors: Kim Phan Le, Eindhoven (NL); Jozef T. M. Van Beek, Rosmalen (NL)

(73) Assignee: NXP B.V., Eindhoven (NL)

( * ) Notice: Subject to any disclaimer, the term of this patent is extended or adjusted under 35 U.S.C. 154(b) by 392 days.

(21) Appl. No.: 12/743,355

(22) PCT Filed: Nov. 12, 2008

(86) PCT No.: PCT/IB2008/054733
§ 371 (c)(1),
(2), (4) Date: May 17, 2010

(87) PCT Pub. No.: WO2009/066203
PCT Pub. Date: May 28, 2009

(65) Prior Publication Data
US 2010/0277262 A1 Nov. 4, 2010

(30) Foreign Application Priority Data

Nov. 19, 2007 (EP) .................................... 07121035

(51) Int. Cl.
*H03H 9/24* (2006.01)
*H03H 9/09* (2006.01)
*H03H 9/125* (2006.01)
*H03H 9/48* (2006.01)

(52) U.S. Cl. ......... 333/186; 333/197; 333/199; 333/200
(58) Field of Classification Search .......... 333/186–189, 333/197–200
See application file for complete search history.

(56) References Cited

U.S. PATENT DOCUMENTS

| 5,025,346 | A | 6/1991 | Tang et al. |
| 6,930,569 | B2* | 8/2005 | Hsu .............................. 333/186 |
| 6,940,370 | B2* | 9/2005 | Bircumshaw et al. ........ 333/197 |
| 7,005,946 | B2 | 2/2006 | Duwel et al. |
| 7,436,271 | B2* | 10/2008 | Weinstein et al. ............ 333/186 |
| 2005/0024165 | A1* | 2/2005 | Hsu .............................. 333/186 |
| 2005/0073078 | A1 | 4/2005 | Lutz et al. |
| 2006/0192463 | A1 | 8/2006 | Cho et al. |

OTHER PUBLICATIONS

Nguyen, Clarkt.C.; "Vibrating RF MEMS Technology: Fuel for an Integrated Micromechanical Circuit Revolution"; 13th Intl Conference on Solid-State Sensors, Actuators and Microsystems, Seoul, Korea, Jun. 5-9, 2005; IEEE, Pisctaway, NJ, US; pp. 243-246.
Agarwal, M., et al; "Non-Linear Cancellation in MEMS Resonators for Improved Power-Handling"; IEEE, Piscataway, NJ, US; Intnl. Electron Devices Meeting, Dec. 5, 2005, IEDM Technical Digest, pp. 286-289.
Kaajakari, Ville, et al; "Non-Linear Limits for Single-Crystal Silicon Microresonators"; IEEE Journal of Microelectromechanical System, vol. 13, issue 5, pp. 715-724, Oct. 2004.
Kaajakari, Ville et al; "Nonlinear Mechanical Effects in Silicon Longitudinal Mode Beam Resonator"; Sensors and Actuators A, vol. 120(1), pp. 64-70, Apr. 29, 2005.

* cited by examiner

*Primary Examiner* — Barbara Summons

(57) ABSTRACT

A resonator comprises a resonator mass (34), a first connector (30) on a first side of the mass connected between the resonator mass and a first fixed mounting and a second connector (32) on a second, opposite, side of the mass connected between the resonator mass and a second fixed mounting. Drive means drives the mass (34) into a resonant mode in which it oscillates in a sideways direction, thereby compressing one of the first and second connectors while extending the other of the first and second connectors.

12 Claims, 7 Drawing Sheets

RESONATOR HAVING A SIDEWAYS OSCILLATION COMPRESSING ONE CONNECTOR WHILE EXTENDING ANOTHER

This invention relates to resonators, in particular MEMS resonators.

MEMS resonators offer a very high Q-factor, small size, high level of integration and low cost. These devices are expected to replace bulky quartz crystals in high-precision oscillators. The devices are used in time-keeping and frequency reference applications such as RF modules in mobile phones, devices containing blue-tooth modules and other digital and telecommunication devices.

Basically MEMS resonators consist of a silicon mass-spring system, which can be excited into mechanical resonant vibration, and means to sense this vibration and to convert it into an electrical signal. In most MEMS resonators, excitation is implemented using electrostatic actuation, and sensing is implemented by a capacitive or piezoresistive method.

There are two important classes of MEMS resonators: flexural mode and bulk acoustic wave (BAW) mode resonators.

Flexural mode resonators rely on the bending of a structure such as a beam, in which the deformation (a combination of expansion, compression and shear) is localized in some parts of the structure. BAW mode resonators rely on vibration of a structure in which the deformation (expansion and compression) takes place in most of the entire volume of the structure. The vibration direction for both modes can be either in-plane or out-of-plane. Longitudinal bulk acoustic wave mode (or in short, longitudinal mode) resonators belongs to the class of BAW mode. In such a device, a structure such as a beam contracts and extends along one direction, which is normally an in-plane direction. In some types of resonators, the mass is a rigid and massive structure which does not significantly deform during vibrating. The connections between the resonating mass and the bulk of the device (e.g. the substrate) function as springs which can deform during vibration. In some other types of resonators, the spring is a part of the mass and the mass is a part of the spring or in some cases they can even be merged in one structure.

In all types of silicon resonators, non-linearity in the spring constant exists, which leads to distortion of vibration at large displacement. This gives rise to a corresponding distortion of the electrical signal, and eventually the bifurcation limit at which hysteresis in the signal vs. frequency curve starts to occur.

Non-linearity in the spring constant originates from material, geometry and electrical non-linearities. This non-linearity manifests itself as spring softening or spring hardening effects, depending on the type and dimensions of the device and the actuation voltages. For example, a longitudinal mode resonator has spring softening during extension, while in some flexural mode resonators such as the clamped-clamped beam, the devices suffer from a spring hardening effect.

Electrical actuation always induces some spring softening effect. The combination of these softening and hardening effects will result in an overall softening or hardening behaviour, depending on the magnitudes and signs of the constituent effects. In longitudinal mode resonators, generally the mechanical non-linearity (geometry and material) can be dominant. But this is not the case for the flexural mode.

It has been proposed to eliminate the non-linearity effect in flexural resonators by biasing the device to an optimum voltage at which the size of the electrical softening is equal to that of the mechanical hardening, so that the two opposite effects cancel each other. However this method only works at a fixed vibration amplitude and a fixed particular voltage regime and layout and only applies to some types of flexural mode resonators.

BAW resonators such as longitudinal mode resonators have been proved to have orders-of-magnitude larger energy storage capacity and higher Q-factor than the flexural mode resonators. BAW resonators are therefore preferred for oscillator applications. For longitudinal mode resonators, the mechanical softening effect is due to narrowing of the beam cross-section when the beam extends during vibration and the negative high-order Young modulus expansion terms. This is because conventional longitudinal resonators work in the extension mode. However, when the beam is compressed, a reversed effect occurs: the beam cross-section is widened leading to a harder spring constant.

FIG. 1 shows a so-called "dog-bone" shaped resonator, which comprises two masses 10, 12 connected by a pair of beams 14 which are anchored in the middle. Actuation electrodes are used to drive the masses apart and together at a resonant frequency.

The structure has non-linear terms in the spring constant, which give rise to distortions in the resulting electrical signal, as explained above.

According to the invention, there is provided a resonator, comprising:
 a resonator mass;
 a first connector on a first side of the mass connected between the resonator mass and a first fixed mounting;
 a second connector on a second, opposite, side of the mass connected between the resonator mass and a second fixed mounting; and
 drive means for driving the mass into a resonant mode in which it oscillates in a sideways direction, thereby compressing one of the first and second connectors while extending the other of the first and second connectors.

The sideways movement of the resonant mass between fixed points provides a push-pull type of resonator in which two springs (the connectors) are connected on both sides of a mass such that one extends and the other contracts during vibration. This arrangement enables the spring softening effect to be significantly reduced and the spring constant becomes much more linear.

Preferably, a sensor arrangement is provided for detecting the mass oscillation. This can be a piezoresistive sensor arrangement or a capacitive sensor arrangement, for example.

The drive means preferably comprises an electrode arrangement on each side of the mass. Each electrode arrangement can comprise a first electrode and a second electrode on opposite sides of a respective one of the connectors. This provides a symmetrical drive arrangement for the resonant mass.

In one drive scheme, the electrode arrangements can be driven with a voltage having the same dc component and opposite phase ac components, and the mass and connectors are earthed. In another arrangement, only one electrode is driven with an ac voltage having a dc components corresponding to the dc voltage, and the mass and connectors are earthed.

The resonator mass may comprise a plurality of mass elements, with adjacent mass elements connected together by a respective intermediate connector. In other words, a number of masses can be connected in series. For example, the resonator mass can comprise two mass elements connected together by an intermediate connector, and wherein the two mass elements vibrate in antiphase.

Examples of the invention will now be described with reference to the accompanying drawings, in which.

The MEMS resonator of the invention has two springs attached to opposite sides of a mass, such that one spring contracts while the other extends during vibration. Due to this arrangement, the softening of one beam during extension is compensated by the hardening of the other beam during compression. The second-order term in the spring constant is therefore cancelled out, leading to a more linear effective spring constant. Advantages include less distortion of signal due to non-linear spring constant, higher critical force and stored energy before the bifurcation occurs.

Figure 1:
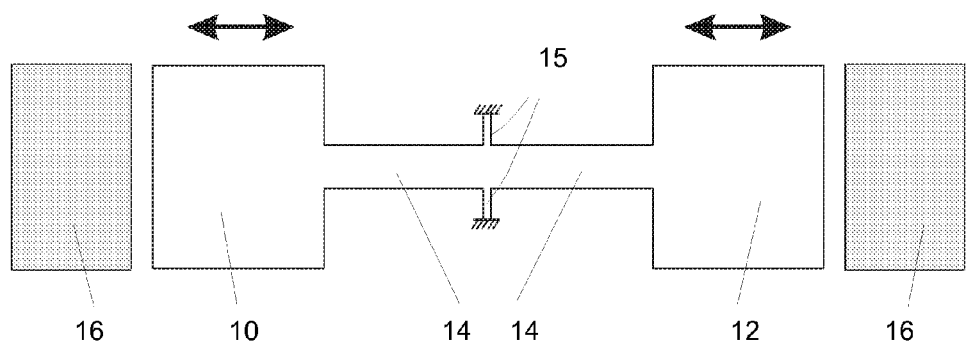
FIG. 1 shows a known so-called "dog bone" resonator.
Figure 2:
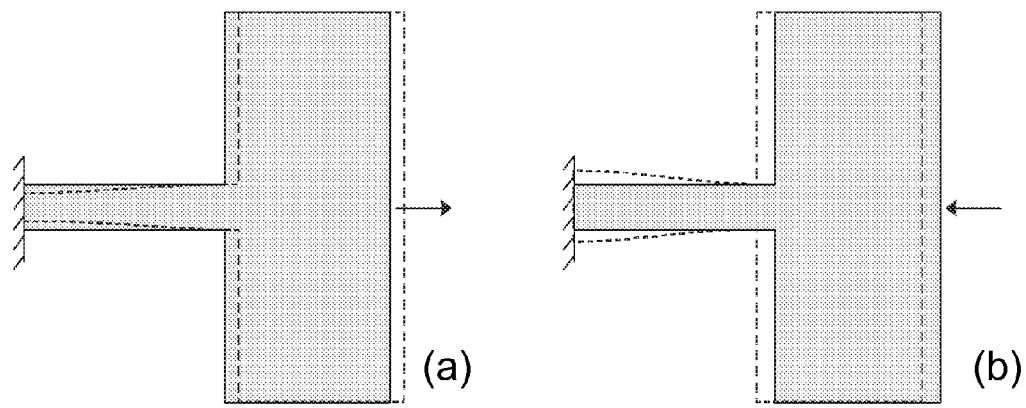
FIG. 2 shows how the resonator of FIG. 1 deforms during compression and extension.

FIG. 2a shows one arm of the conventional dog-bone resonator of FIG. 1. During operation, a DC and an AC voltage are applied to the electrode (not shown) to bring the mass into resonant vibration. Due to the attraction nature of the electrostatic force, the spring is constantly working in the extension mode. In this mode, the spring cross-section becomes smaller, proportional to the strain. The higher the strain, the smaller the cross-section and therefore the softer the spring is. This is called the spring softening effect.

If somehow the spring could work in the compression mode (FIG. 2b), a reverse phenomenon would occur: the cross-section of the spring is widened, leading to the hardening effect.

Figure 3:
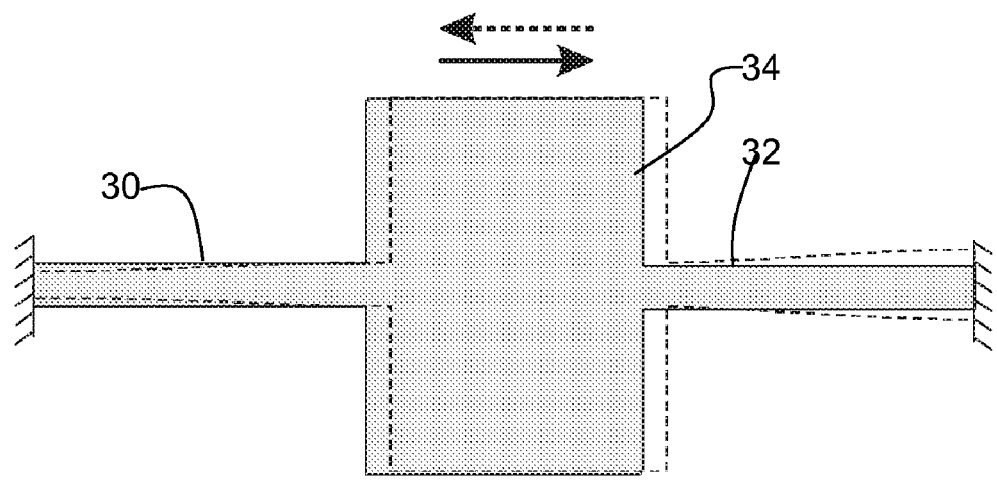
FIG. 3 shows a first example of resonator of the invention.

An example of resonator of the invention is shown in FIG. 3. In this design, two identical beams 30,32 are attached to the mass 34 at two opposite sides. The outer ends of the beams are fixed, so that any movement of mass towards one fixed point gives rise to a corresponding movement away from the other fixed point. The vibration direction is along the beams. During vibration, for instance when the mass moves to the right, the beam on the left extends and becomes softer while the beam on the right contracts and thus becomes harder. The dotted line is the exaggerated outline of the resonator when the mass moves to the right.

Consequently, the softening of the left beam is compensated by the hardening of the right beam, leading to more linear effective spring constant. The restoring force is the sum of the pushing force of one beam and the pulling force of the other beam. To illustrate the benefit of this approach, calculations of the effective spring constant are given below.

Figure 4:
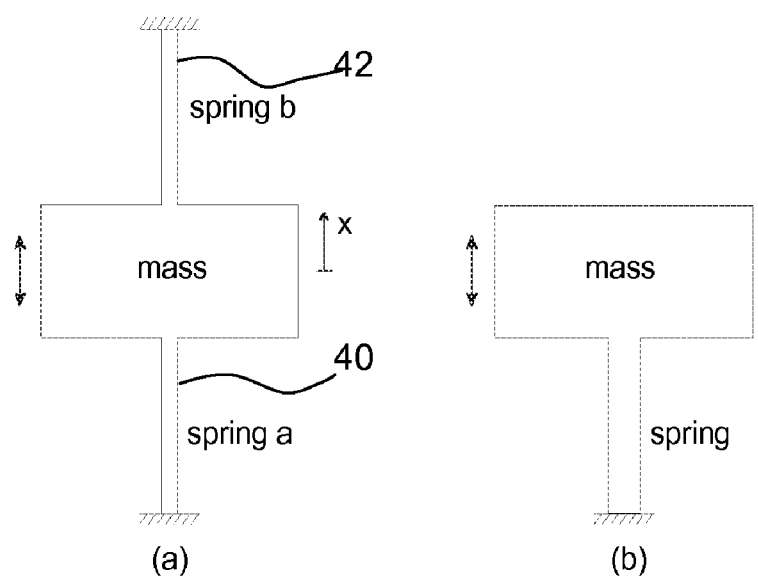
FIG. 4 is used for a mathematical analysis of the resonator characteristics of FIGS. 1 and 3.

FIG. 4a shows the resonator layout of the invention, which can be described as a push-pull resonator, and FIG. 4b shows the conventional dog-bone layout for comparison. For comparison, the cross-section of the spring in FIG. 4b is double those in FIG. 4a.

First, the push-pull concept is considered. Suppose the mass moves upwards in +x direction (FIG. 4a), the spring constants of two identical springs 40,42 (spring a and spring b) are:

$$k_a(x) = k_0(1 + k_1 x + k_2 x^2) \text{(extension mode)} \quad (1)$$

$$k_b(-x) = k_0(1 + k_1(-x) + k_2(-x)^2) = k_0(1 - k_1 x + k_2 x^2) \quad (2)$$

Equation (2) is the compression mode, and in this case x is considered negative compared to the extension mode.

If it is assumed that the mass is a rigid structure and not (significantly) deforming during operation, the non-linear spring constants of a beam stressed in the longitudinal direction are:

$$k_0 = \frac{\pi^2}{8} \frac{AY_0}{L}; k_1 = \frac{\pi Y_1}{2L}; k_2 = \frac{\pi^2 Y_2}{4L^2}; \quad (3)$$

In which the non-linear Young's modulus is $$Y = Y_0(1 + Y_1 S + Y_2 S^2), \text{ where S is the engineering strain.} \quad (4)$$

In equation (3), the non-linear effects of both geometry and material are taken into account. Because the stiffness of the two springs can be added in this system, the effective spring constant of the system is as follows:

$$k_{eff}(x) = k_a(x) + k_b(-x) \quad (5)$$

Replacing (1), (2) into (5) gives:

$$k_{push-pull}(x) = 2k_0(1 + 0x + k_2 x^2) \quad (6)$$

Note that $k_1$ has been cancelled out in the above formula. The restoring force is:

$$F_{push-pull}(x) = -k_{eff}(x)x = -2k_0(x + 0x^2 + k_2 x^3) \quad (7)$$

In order to compare to the conventional dog-bone structure, a dog-bone structure is considered with the same effective mass, the same beam length L but double cross-section area 2A. The cross-section area is doubled to keep the linear spring constant the same as in the push-pull system. The restoring force of the dog-bone resonator is:

$$F_{dogbone}(x) = -k_{eff}(x)x = -2k_0(x + k_1 x^2 + k_2 x^3) \quad (8)$$

In the case of the dog-bone resonator, the quadratic terms $x^2$ in the force are mainly responsible for the softening in the extension mode and the hardening in the compression mode (if the device could be arranged to work in this mode).

Figure 5:
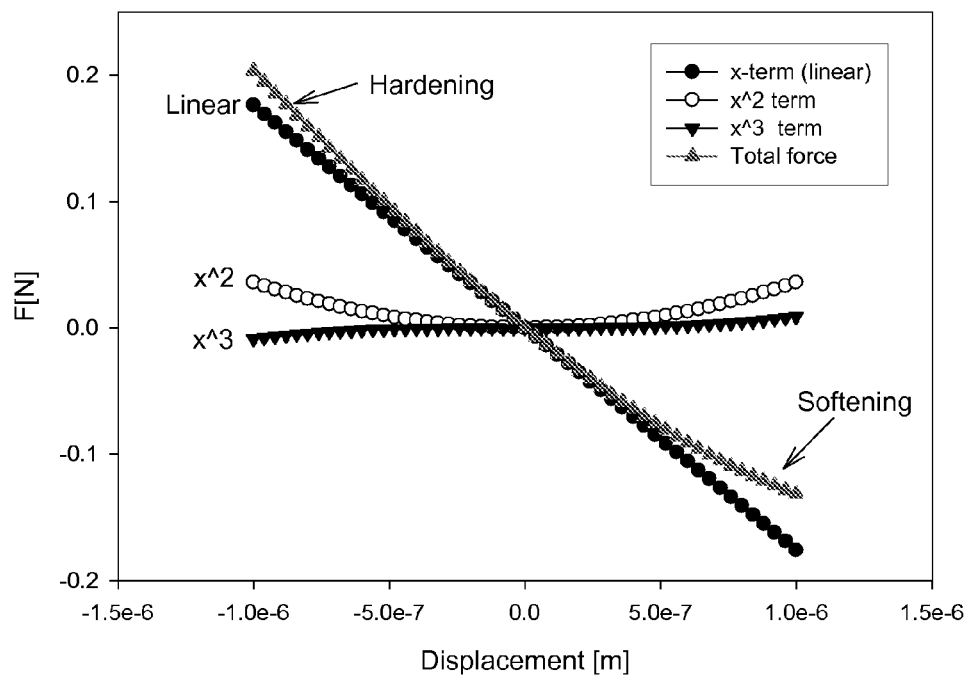
FIG. 5 shows graphically the results of the mathematical analysis based on FIG. 4 for the known dog-bone resonator.

In FIG. 5, contributions of the polynomial terms to the total restoring force for a dog-bone resonator are given to illustrate the effect of the quadratic term. The displacement x has been exaggerated to show the tendency of the curves. In the case of the push-pull resonator, due to the push-pull construction, the quadratic term (and all the higher even terms if present) is cancelled out, see equation (7).

In other words, the spring softening of the extending spring is compensated by the spring hardening of the contracting spring.

Figure 6:
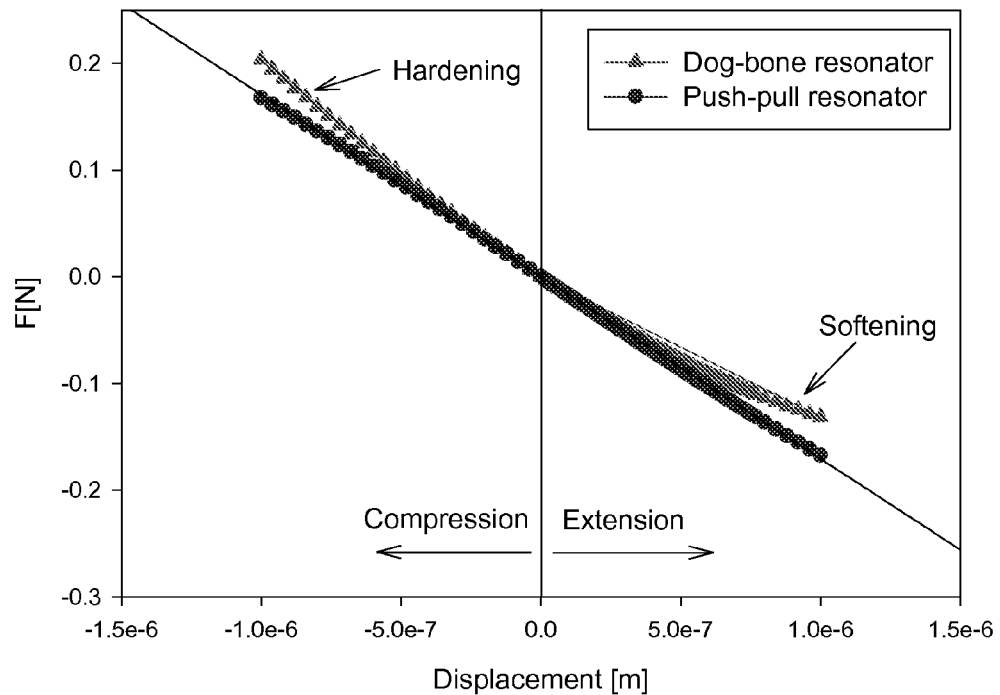
FIG. 6 shows graphically the results of the mathematical analysis based on FIG. 4 for the resonator of the invention.

FIG. 6 shows the effect of the quadratic term cancellation of the push-pull spring system, compared to the convention dog-bone case. The large softening in the extension mode and hardening in the compression mode have been suppressed in the push-pull compared to the dog-bone, leaving only a small symmetrical softening effect for both directions of displacement. Cancellation of the quadratic term improves significantly the spring constant linearity.

In FIG. 5 and FIG. 6, $Y_0$=170 GPa; $Y_1$=−2.6; $Y_2$=−8.1; A=1.4 μm*6 μm; L=20 μm. In these examples it is assumed that the beams are in the [110] direction of the Si crystal.

One major advantage of the more linear spring constant is that the signal will be less distorted, with smaller high-ordered harmonics, at large strain. Another advantage is that the non-linear limit, at which bifurcation occurs, will be extended. If more power, thus more force, is applied on the resonator, its vibration becomes larger and at a certain critical value, bifurcation occurs in the signal-frequency curve. Beyond this point, the curve has hysteresis, which should be avoided in applications. The critical force at the bifurcation point is explained in the article "Non-Linear cancellation in MEMS resonators for improved power handling" Agarwal, Park et al, IEDM 2005:

$$f_{lim} = \sqrt{\frac{32m^2\omega_0\lambda^3}{3\sqrt{3}\,|\kappa|}} \; ; \text{with } \kappa = \left(\frac{3k_2}{8} - \frac{5k_1^2}{12}\right); \lambda = \frac{\omega_0}{2Q} \quad (9)$$

In the above formula, m is the effective mass, $\omega_0$ is the resonant frequency and $\lambda$ is the damping coefficient.

If the value $\alpha$ is defined as the ratio of the critical force of the push-pull resonator to that of the dog-bone:

$$\alpha = f_{lim\_push-pull} / f_{lim\_dogbone} = \sqrt{\frac{|\kappa_{dogbone}|}{|\kappa_{push-pull}|}} = \sqrt{\left|1 - \frac{10}{9}\frac{k_1^2}{k_2}\right|} \quad (10)$$

It is clear that $\alpha$ is not geometry-dependent (L has been cancelled out) and only depends on the material properties (non-linear Young's modulus terms). Using $Y_1$=−2.6 and $Y_2$=−8.1 as in the examples above, this gives $\alpha$=1.4. That means the maximum force that can be exerted to the push-pull beam before bifurcation occurs is 1.4 times higher than that for the dog-bone resonator.

Because the maximum vibration amplitude at bifurcation is:

$$x_c = \frac{2}{\sqrt{3\sqrt{3}\,Q|\kappa|}},$$

the maximum vibration amplitude in the case of the push-pull is also $\alpha$ times (i.e. 1.4 times) higher than that of the dog-bone structure.

Furthermore, the energy stored in the resonator at the critical point is $\alpha$ squared times, that is 1.96 times, higher than that of the dog-bone resonator:

$$E_c = \frac{1}{2}k_0 x_c^2 \quad (11)$$

The non-linear limit is often presented by the hyperbolic relation between $V_{AC}$ and $V_{DC}$:

$$V_{DC}V_{AC} = \frac{f_{lim}g^2}{\varepsilon A_{electrode}} \quad (12)$$

Figure 7:
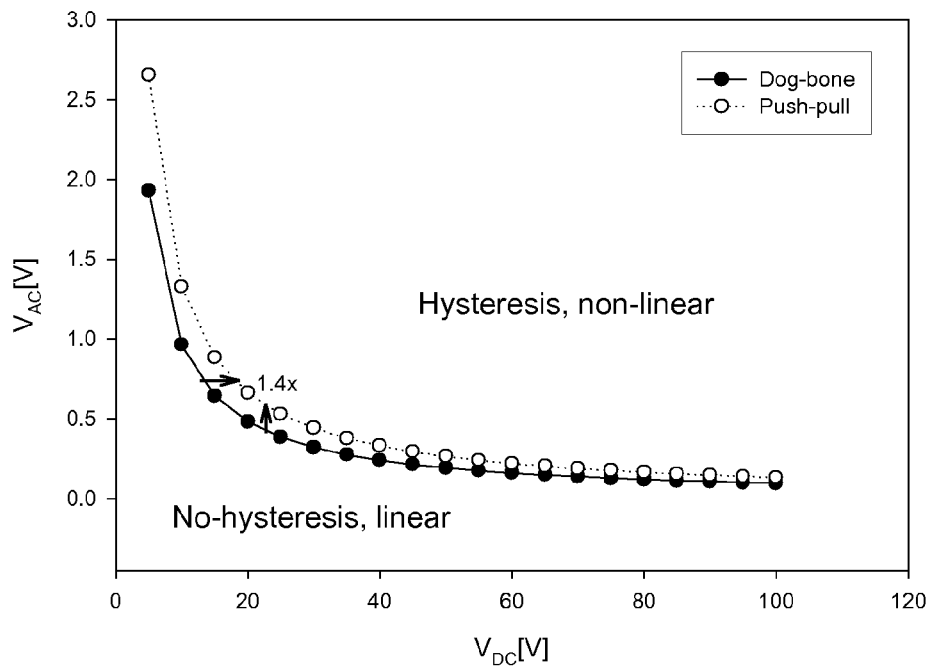
FIG. 7 shows graphically how the non-linear limit is extended in the resonator of the invention.

FIG. 7 shows the curve of the ac voltage versus the dc voltage at the bifurcation limit given by equation (12), for the push-pull design and the dog bone design. When $V_{DC}$ and $V_{AC}$ are under the curve, the resonator exhibits no hysteresis and when they are at or above the curve, bifurcation or hysteresis will occur, respectively. Comparing the push-pull concept to the dog-bone, the curve of the push-pull shifts upwards by 1.4 times compared to the dog-bone, as shown.

When operating in the compression mode, buckling may happen if the actuation force exceeds a certain limit. To make use of the advantages of the push-pull resonator, buckling should not happen. Therefore the buckling limit should be larger than the critical force at bifurcation. Instead of comparing forces, this can be analysed by comparing strains in both cases:

The strain limit before bifurcation is:

$$\varepsilon_c = \frac{2/L}{\sqrt{3\sqrt{3}\,Q|\kappa|}} = \frac{2/L}{\sqrt{3\sqrt{3}\,Q\left|\frac{3k_2}{8}\right|}} \quad (13)$$

$$\varepsilon_c = \frac{16}{3\pi\sqrt{\frac{3\sqrt{3}}{2}|Y_2|Q}}$$

The buckling limit in the case of free beam (one end of the beam is free to rotate):

$$F_b = \frac{\pi^2}{12}\frac{Ebh^3}{L^2}$$

And the buckling strain limit is:

$$\varepsilon_b = \frac{F_b}{Ebh} = \frac{\pi^2}{12}\frac{h^2}{L^2} \quad (14)$$

In the case when both ends of the beam are not free to rotate:

$$\varepsilon_b = \frac{4\pi^2}{12}\frac{h^2}{L^2} \quad (15)$$

In the push-pull case, the actual buckling limit is somewhere in between the values expressed in equations (14) and (15) because a beam is partly constrained by the mass and the other beam. The worst case of equation (13) is considered.

Taking an example for a push-pull resonator having L=20 μm, Q=60000, the bifurcation limit is $\varepsilon_c$=1.51E-3, while the smallest buckling limit (given by equation 13) is $\varepsilon_b$=4.03E-3. That means buckling does not occur before the bifurcation limit is reached in this particular design. $\varepsilon_c$ depends only on the Q-factor and material properties, and thus cannot be changed easily, but $\varepsilon_b$ depends strongly on geometry (beam height and beam length). As a result, the buckling limit can easily be adjusted to be larger than the bifurcation limit by slightly changing the geometry.

Figure 8:
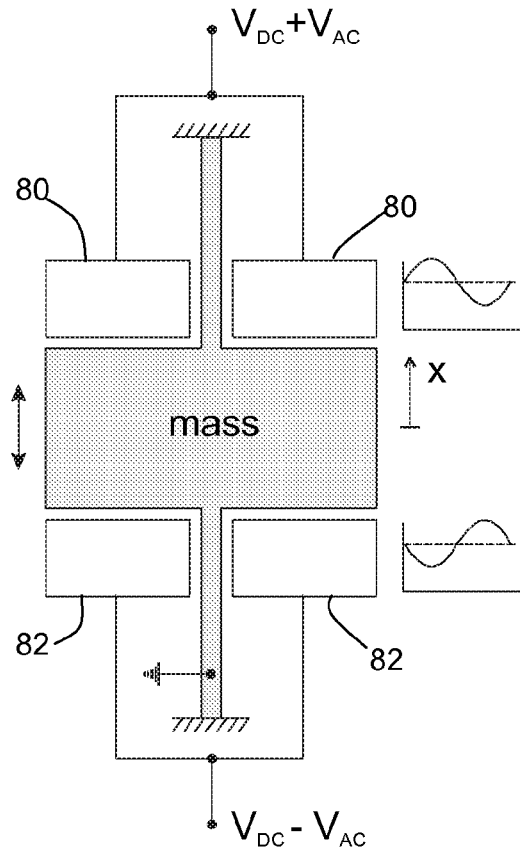
FIG. 8 shows an example of electrode connections for the resonator of the invention.

Ideally the push-pull resonator should be actuated symmetrically around the rest position, which means the mass should be pulled from both sides. An electrode arrangement shown in FIG. 8 can be used for this purpose.

Each side of the mass is associated with a pair of electrodes 80, 82, to which the same dc offset voltage is applied, but with opposite sign ac component, as shown. The mass and beams are earthed, as also shown.

During the first halve of the $V_{AC}$ cycle, the mass is pulled upwards, and during the second halve, it is pulled down. The DC forces are exerted equally from both sides of the mass therefore cancelled out. The total electrical force exerted on the mass is the difference between the forces created by the upper electrodes and the lower electrodes:

$$f_{el} = \frac{1}{2} \frac{C_0 g}{(g-x)^2} (V_{DC} + V_{AC})^2 - \frac{1}{2} \frac{C_0 g}{(g+x)^2} (V_{DC} - V_{AC})^2 \quad (16)$$

in which $C_0 = \epsilon A_{el}/g$;

Using the Taylor's expansion, equation (16) can be approximated by:

$$f_{el} \approx \frac{1}{2} \frac{C_0}{g} (V_{DC} + V_{AC})^2 \left(1 + \frac{2x}{g} + \frac{3x^2}{g^2} + \frac{4x^3}{g^3} + \ldots \right) - \frac{1}{2} \frac{C_0}{g} (V_{DC} - V_{AC})^2 \left(1 - \frac{2x}{g} + \frac{3x^2}{g^2} - \frac{4x^3}{g^3} + \ldots \right) \quad (17)$$

Finally (17) becomes:

$$f_{el} \approx 2 \frac{C_0}{g} \left( V_{DC} V_{AC} + \frac{V_{DC}^2}{g} x \right) \quad (18)$$

In the calculation of (18), all terms having either $V_{AC}^2$, $x^2$ or $V_{AC}*x$ have been approximated to zero because both $V_{AC}$ and x are very small.

Equation (18) states that the electrical force in this case is just doubled compared to the case when electrodes are arranged at one side of the mass. There is no cancellation effect in this case.

The push-pull resonator can be sensed both by capacitance as well as piezoresistive methods. In the following, some examples of sensing methods will be given.

Figure 9:
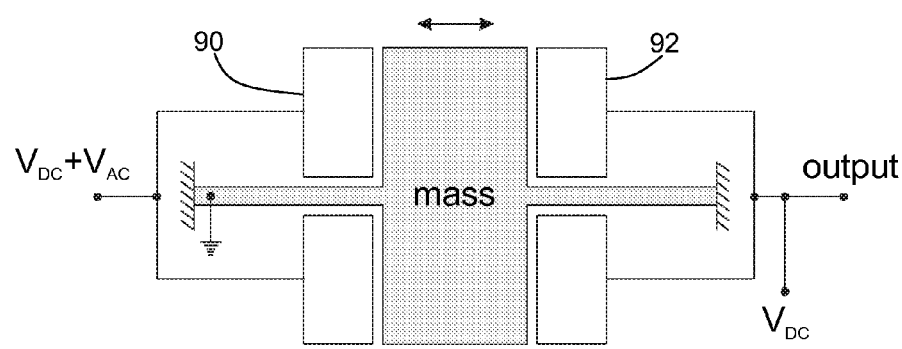
FIG. 9 shows how a capacitive sensing method can be used with the resonator of the invention.

In FIG. 9, the resonator is sensed by capacitive measurement. The electrodes 90 on the left are used for actuation and the electrodes 92 on the right are used for sensing. The beam is again grounded.

A disadvantage of the capacitive method is that the opposite phase ac signal cannot be applied to one side of the mass (the right electrodes in this example). Therefore, the actuation force is reduced by half.

Figure 10:
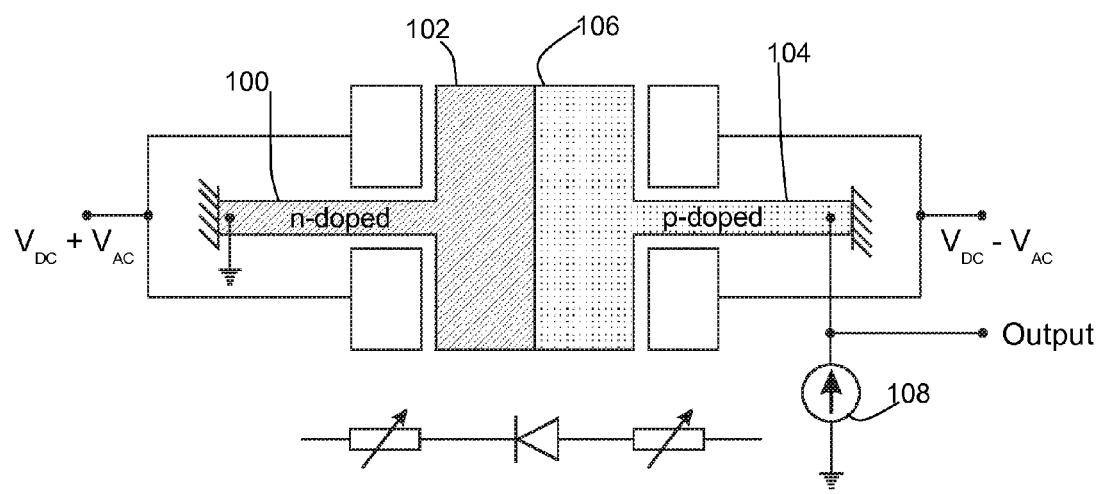
FIG. 10 shows how a first implementation of piezoresistive sensing method can be used with the resonator of the invention.

FIG. 10 shows the layout of a push-pull resonator with piezoresistive sensing. This enables all electrodes to be free for actuation and the actuation force is doubled. In FIG. 10, one side of the resonator (including one beam 100 and a half 102 of the mass) is n-doped and the other side (including the other beam 104 and the other half 106 of the mass) is p-doped. It is known that p-doped silicon has positive piezoresistive effect and n-doped silicon has negative piezoresistive effect. Thus, the preferred beam material of silicon can be used to provide part of the sensing arrangement. Furthermore, the piezoresistive gauge factor depends on the doping level, strain direction with respect to the crystallographic orientations, and temperature.

During vibration, one beam extends while the other contracts. As a result of the opposite signs of the piezoresistive effect, the resistance changes in the beams are in phase and the total change of the two resistors connected in series can be detected. The equivalent circuit of the beams is shown in FIG. 10.

A current source 108 is applied to the beam to detect the resistance change.

The two doped regions make contact in the middle of the mass, forming a diode. The diode effect is not desired, due to its non-linear V-I curve. However, if the diode is forward biased at a suitable point, the non-linearity behavior can be minimized.

Figure 11:
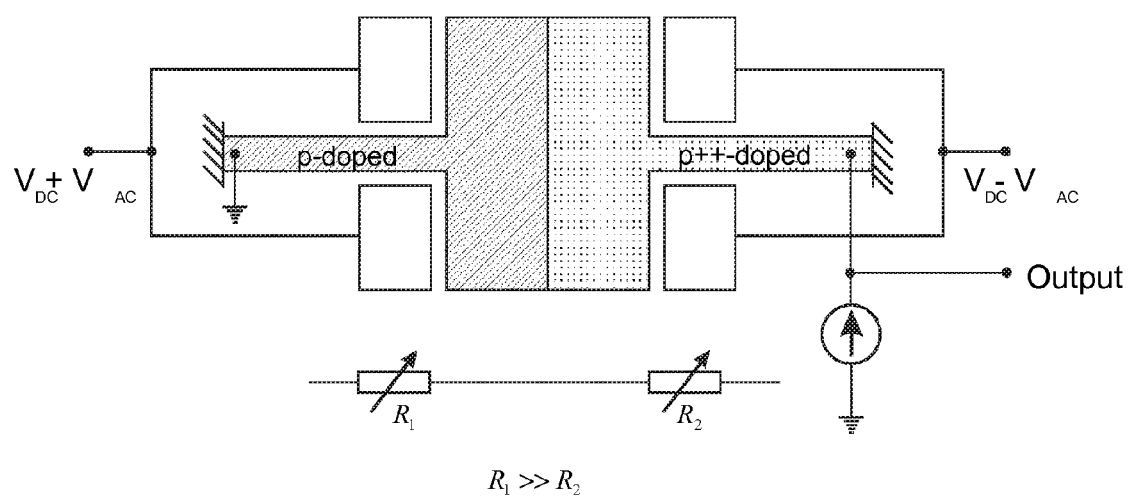
FIG. 11 shows how a second implementation of piezoresistive sensing method can be used with the resonator of the invention.

The same piezoresistive effect can be obtained by making one side of the resonator lightly doped (n- or p-type) and the other side heavily doped. This is shown in FIG. 11, in which the left spring is p-doped and the right spring is p++ doped. Otherwise, the arrangement is the same as in FIG. 10. The total change of resistance at resonance can almost totally be attributed to the lightly doped part, since the heavily doped region has a much lower resistance. Its (absolute) change of resistance can be neglected. In this way, the diode effect is avoided, as can be seen from the equivalent circuit in FIG. 11.

To minimize the vibration energy dissipating into the substrate, a symmetrical structure is always preferred, like the known dog-bone structure in FIG. 1, where the movement of one arm is counterbalanced by the movement of the other arm in the opposite direction.

Figure 12:
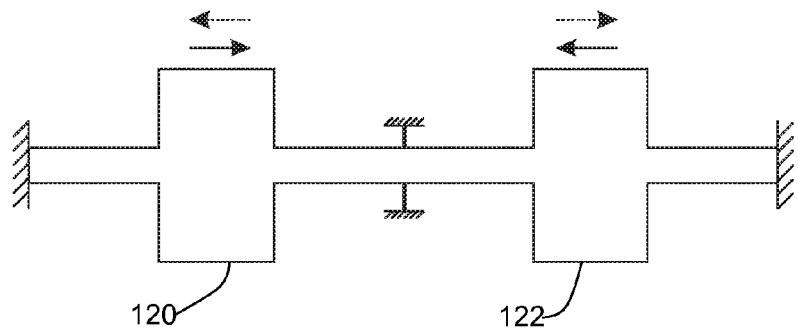
FIG. 12 shows the connection of multiple resonators of the invention.

For the push-pull device of the invention, a similar technique can be used as shown in FIG. 12, in which two push-pull resonators 120,122 vibrate in antiphase.

Generally, n resonators can be connected in this way, in which n is an even number. An advantage is that more energy can be stored, thus more signal can be obtained.

Figure 13:
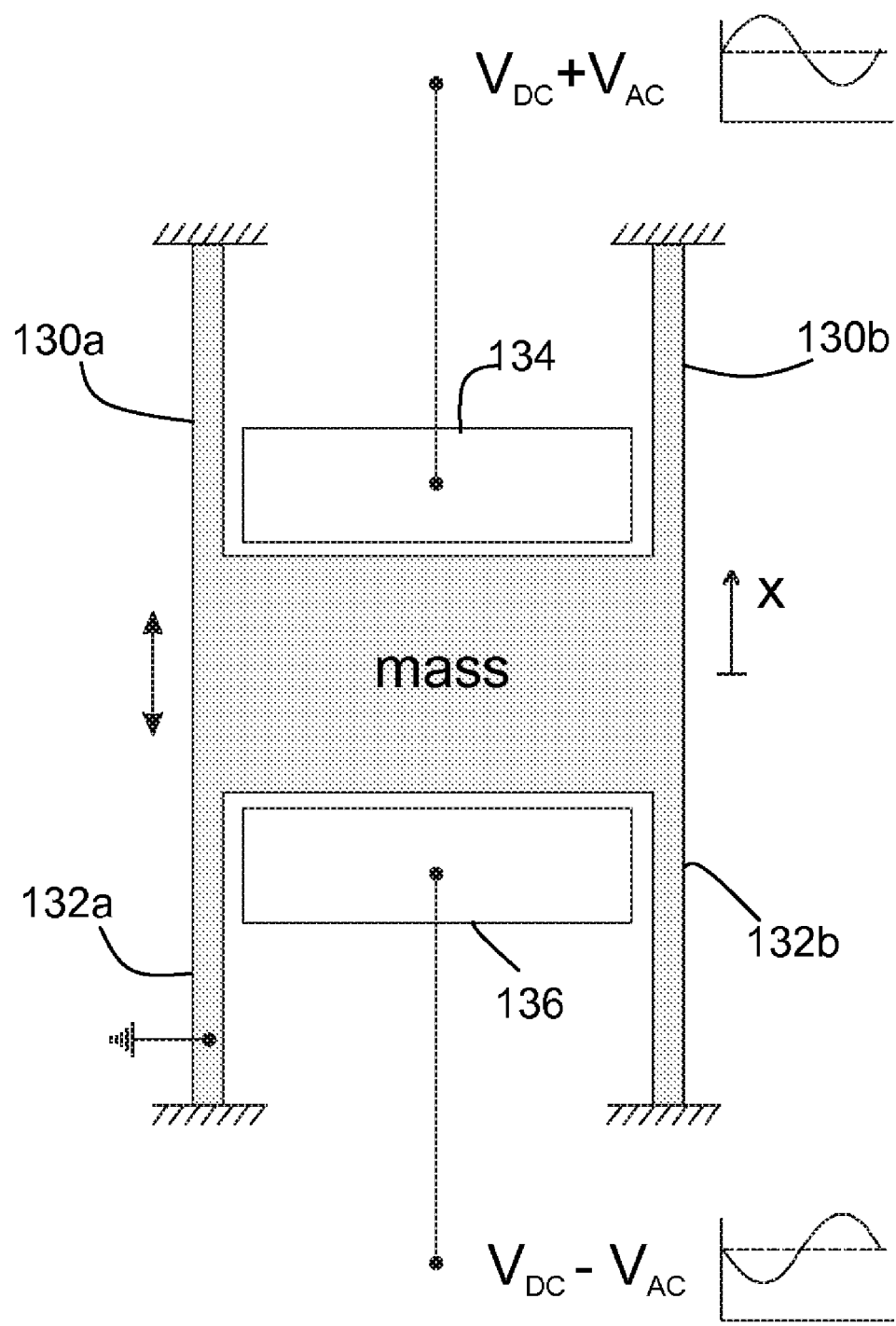
FIG. 13 shows an alternative sensing electrode and connector arrangement.

FIG. 13 shows that each connector can comprise multiple parallel arms. In the example of FIG. 13, each connector has two parallel arms, 130a,130b and 132a,132b. The electrode 134,136 on each side of the mass is then sandwiched between the arms, as shown.

The push-pull resonator has been shown to have a more linear mechanical stiffness due to cancellation of the even terms in the restoring force. This is because the softening effect while extending one arm is compensated by the hardening effect while compressing the other arm. One advantage of the more linear spring constant is that the signal will be less distorted (smaller high-ordered harmonics) at large strain.

Another advantage of the proposed resonator is that the non-linear limit, at which bifurcation occurs, will be extended: the critical force is increased by 1.4 times and the maximum energy stored in the device before bifurcation is increased by 1.96 times (example for Si [110]), independently on the resonator geometry.

Typically the bifurcation limit is smaller than the buckling limit, if a suitable geometry is chosen.

MEMS resonators are the vital component of oscillators which are used in time-keeping and frequency reference applications such as RF modules in mobile phones, devices containing blue-tooth modules and other digital and telecommunication devices. The invention provides improved characteristics for all of these applications.

The manufacture of the resonator has not been described, as this will be routine to those skilled in the art, and known techniques for fabricating existing MEMS resonators can be used. The materials used can also be entirely conventional, and the invention can be implemented simply as a change in patterning of the layers making up the resonator.

Various modifications will be apparent to those skilled in the art.

The invention claimed is:

1. A resonator, comprising:
   a resonator mass;
   a first connector on a first side of the mass connected between the resonator mass and a first fixed mounting;
   a second connector on a second, opposite, side of the mass connected between the resonator mass and a second fixed mounting; and
   drive means for driving the mass into a resonant mode in which it oscillates in a sideways direction, thereby compressing one of the first and second connectors while extending the other of the first and second connectors.

2. A resonator as claimed in claim 1, further comprising a sensor arrangement for detecting the mass oscillation.

3. A resonator as claimed in claim 2, wherein the sensor arrangement comprises a piezoresistive sensor arrangement.

4. A resonator as claimed in claim 2, wherein the sensor arrangement comprises a capacitive sensor arrangement.

5. A resonator as claimed in claim 1, wherein the drive means comprises an electrode arrangement on each side of the mass.

6. A resonator as claimed in claim 5, wherein each electrode arrangement comprises a first electrode and a second electrode on opposite sides of a respective one of the connectors.

7. A resonator as claimed in claim 5, wherein the first connector comprises first and second parallel arms, and the corresponding electrode arrangement comprises an electrode between the arms of the first connector arrangement, and wherein the second connector comprises first and second parallel arms, and the corresponding electrode arrangement comprises an electrode between the arms of the second connector arrangement.

8. A resonator as claimed in claim 5, wherein the electrode arrangements are driven with a voltage having the same dc component and opposite phase ac components, and the mass and connectors are earthed.

9. A resonator as claimed in claim 5, wherein one electrode arrangement is driven with a dc voltage, and the other is driven with an ac voltage having a dc components corresponding to the dc voltage, and the mass and connectors are earthed.

10. A resonator as claimed in claim 1, wherein each connector comprises a plurality of arms in parallel.

11. A resonator as claimed in claim 1, wherein the resonator mass comprises a plurality of mass elements, with adjacent mass elements connected together by a respective intermediate connector.

12. A resonator as claimed in claim 11, wherein the resonator mass comprises two mass elements connected together by an intermediate connector, and wherein the two mass elements vibrate in antiphase.

* * * * *